(12) United States Patent
Zeng et al.

(10) Patent No.: US 6,243,272 B1
(45) Date of Patent: Jun. 5, 2001

(54) METHOD AND APPARATUS FOR INTERCONNECTING MULTIPLE DEVICES ON A CIRCUIT BOARD

(75) Inventors: Ming Zeng, San Jose; Sanjay Dabral, Palo Alto, both of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/336,486

(22) Filed: Jun. 18, 1999

(51) Int. Cl.$^7$ ........................................................ H05K 1/18
(52) U.S. Cl. .......................... 361/760; 361/765; 361/775; 174/255; 174/260; 174/261; 174/262; 174/266; 257/698; 257/773; 257/774
(58) Field of Search ..................................... 361/760, 764, 361/765, 775, 777, 783; 174/255, 260, 261, 262, 266; 257/698, 773, 774; 365/52, 63; 228/180.21, 180.22

(56) References Cited

U.S. PATENT DOCUMENTS

| | | |
|---|---|---|
| 5,241,456 * | 8/1993 | Marcinkiewicz et al. ........... 361/792 |
| 5,502,621 | 3/1996 | Schumacher et al. .............. 361/760 |
| 5,513,135 * | 4/1996 | Dell et al. ............................... 365/62 |
| 5,831,890 * | 11/1998 | Selna et al. ............................ 365/51 |
| 5,841,686 * | 11/1998 | Chu et al. .............................. 365/51 |
| 5,982,654 * | 11/1999 | Corisis .................................... 365/63 |
| 5,986,893 * | 11/1999 | Leigh et al. ......................... 361/777 |
| 5,998,864 * | 12/1999 | Khandros et al. ................... 257/723 |

* cited by examiner

*Primary Examiner*—Jeffrey Gaffin
*Assistant Examiner*—David Foster
(74) *Attorney, Agent, or Firm*—Jeffrey S. Draeger

(57) ABSTRACT

A method and apparatus interconnecting multiple devices on a circuit board. One disclosed circuit board has a first attach region on a first surface for coupling a first set of pins from a first device to a set of signal lines. A second attach region on a second surface is for coupling a second set of pins from a second device to the set of signal lines. The second attach region is predominantly non-overlapping with respect to the first attach region.

26 Claims, 5 Drawing Sheets

METHOD AND APPARATUS FOR INTERCONNECTING MULTIPLE DEVICES ON A CIRCUIT BOARD

BACKGROUND

1. Field of the Invention

The present invention pertains to the field of bus topologies. More particularly, the present invention pertains to an improved multiple load bus topology and associated circuit boards, systems, and methods.

2. Description of Related Art

The performance and cost of a circuit board in a multi-load topology are influenced by numerous design parameters. For example, routing between components on the circuit board, the placement of such components, and the types of vias used to interconnect different layers of routing in the circuit board all play an important role in determining the cost and performance of a circuit board. In the case of a circuit board intended for high-volume manufacturing, it may be advantageous to provide high performance while limiting overall cost; however, often high performance and low cost are conflicting goals.

Package routing refers to the routing of signal lines from pads of an integrated circuit to component pins. Pins are interconnect nodes that transfer signals from the component to circuit board traces and may take any of a variety of known or otherwise available forms (e.g., pins, solder balls, solder columns, etc.). Circuit board traces are signal lines as they are routed through one or more layers of the circuit board, and the bus length for a particular bus is the length of the traces that comprise the bus. As referred to herein, a stub offset is the distance on the bus between two connections to a single circuit board trace, and a chip offset is the horizontal distance in the plane of a circuit board between the midpoints of two devices mounted on the circuit board.

A typical circuit board may have numerous layers of traces within the circuit board to transmit signals from components mounted on both sides of the circuit board. Thus, trace routing is a complex three-dimensional problem which may be further complicated by the large number of pins densely populating modern components. Additionally, some systems may have design specific constraints such as a maximum trace length, or a requirement of some degree of consistency between trace lengths.

One prior art multi-load bus topology attaches devices to a bus arranged in a straight line on a single surface of a circuit board. As additional devices are added, such a bus necessarily becomes longer. At a certain point, the bus may be too long for signals to propagate between components within predetermined periods of time associated with proper bus operation. For example, in a system operating with a common bus clock between components, the bus may become too long for signals to propagate from end to end during a cycle of the common clock. In such cases, to provide operation at higher common clock frequencies, techniques that allow shortening of the bus may be required.

One prior art technique that shortens the total length of the bus is shown in FIG. 1a. This prior art technique involves mounting devices on opposite sides of a circuit board in an overlapping manner. In FIG. 1a, a device 155 is mounted on a first side of a circuit board 150, and a device 160 is mounted on a second side of the circuit board 150. Typically, many pins that need to be connected are not aligned. In cases where pins are aligned (e.g., pins 157 and 161), a through-hole via 162 may be used to connect both pins to a signal line 164 at a single connection point 165. Nonetheless, the connection of two stubs at a single connection point 165 may disadvantageously reduce signal quality when high frequency signaling is involved.

With respect to unaligned pins, expensive partial via techniques (e.g., blind and buried vias) may be needed to make the appropriate connections. For example, to connect pins 158 and 180 respectively from the device 155 and the device 160 to a signal line 170, a partial via 166 and a partial via 174 respectively are used. Notably, the connection points 172 and 176 are spaced apart so that the stubs do not connect at a single point; however, the fully overlapping nature of devices 155 and 160 (i.e., being directly above/below each other) does not guarantee that a minimum stub offset can be maintained between pins. Therefore, disadvantages of this prior art approach may include the use of expensive vias and/or the inability to ensure minimum stub offsets.

Another prior art technique that allows mounting overlapping components on opposite sides of a circuit board is shown in FIG. 1b (see also, e.g., U.S. Pat. No. 5,502,621). This technique also involves-mounting a device 110 on a first side of a printed circuit board 105 and a device 135 on a second side of the printed circuit board 105; however, the device 135 has corresponding pin positions in mirror image locations with respect to the device 110. Corresponding pins are pins that are connected together in the system such as pins 115 and 130. In some systems, corresponding pins may be pins such as data bus pins (e.g., D1 of device 1 is connected to D1 of devices 2, 3, etc.), address bus pins, or certain control pins.

Due to the mirror image pin locations, simplified signal routing may be achieved because numerous corresponding pins from the device 110 and device 135 are directly opposite one another. For example, a pin 115 and a pin 130 may be connected together and to a signal line 140 at a single connection point 125 by a single through-hole via 120. This technique, however, requires that a particular device be designed with multiple pin arrangements (standard and mirror image), thereby increasing the cost of manufacturing and maintaining inventory of the device. Additionally, both stubs connecting the devices 110 and 135 terminate at a single connection point 125, which may undesirably reduce signal quality.

Accordingly, there is a continuing need to develop low cost and/or high speed circuit boards that maintain an appropriate signal level quality.

SUMMARY

A method and apparatus interconnecting multiple devices on a circuit board is disclosed. One disclosed circuit board has a first attach region on a first surface for coupling a first set of pins from a first device to a set of signal lines. A second attach region on a second surface is for coupling a second set of pins from a second device to the set of signal lines. The second attach region is predominantly non-overlapping with respect to the first attach region.

BRIEF DESCRIPTION OF THE FIGURES

The present invention is illustrated by way of example and not limitation in the figures of the accompanying drawings.

FIG. 2b illustrates a top view of the circuit board in FIG. 2a.

FIG. 4b illustrates a top view of the circuit board in FIG. 4a.

DETAILED DESCRIPTION

The following description provides a method and apparatus for interconnecting multiple devices on a circuit board. In the following description, numerous specific details such as device types, pin structures, packaging technologies and logic partitioning/integration choices are set forth in order to provide a more thorough understanding of the present invention. It will be appreciated, however, by one skilled in the art that the invention may be practiced without such specific details.

Rather than simply continuously crowding components and shortening distances between signal pins, some embodiments of the present invention allow an economical high speed circuit board design by staggering components on opposite sides of a circuit board. In some embodiments, staggering devices on opposite sides of the circuit board actually enhances signal quality by providing at least some minimum stub offset between stub connections to each signal trace. Additionally, staggering devices so that they are at least partially non-overlapping allows the use of through-hole vias in some embodiments, thereby providing a less expensive circuit board design. Furthermore, in some embodiments, signals may be grouped by their signal type to maintain better signal quality for a particular set of signals.

Figure 1A:
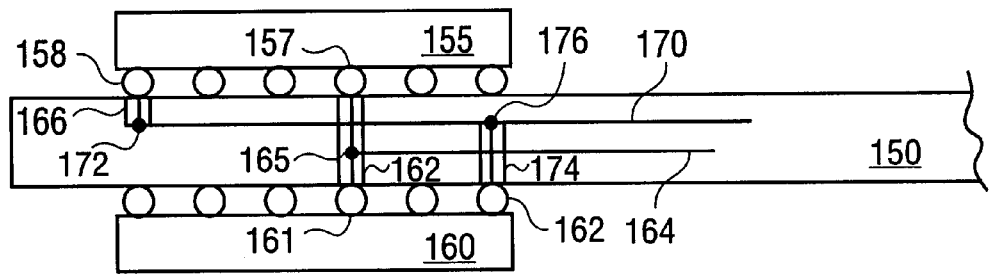
FIG. 1a illustrates a prior art circuit board utilizing complex via structures to support two fully overlapping devices without mirror image pin locations.
Figure 1B:
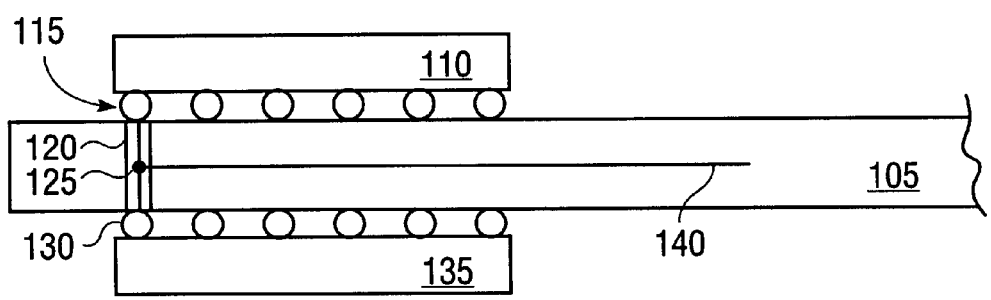
FIG. 1b illustrates a prior art circuit board having fully overlapping devices with mirror image pin locations.
Figure 2A:
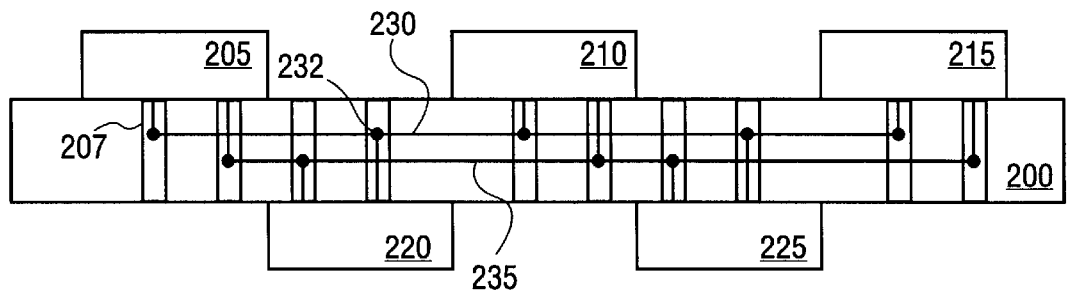
FIG. 2a illustrates one embodiment of a circuit board having non-overlapping devices mounted on opposite sides of the circuit board.

FIG. 2a illustrates one embodiment of a circuit board 200 having devices mounted on both sides and using through-hole vias to connect pins from the devices to signal traces in the circuit board 200. Once again, "pins" may be pins, solder balls, solder columns, or any other known or available interconnection mechanism or structure for signals from devices to a circuit board. The area of a device populated with pins may be referred to as the attach region, and the circuit board has a corresponding attach region which interfaces with the device attach region.

A device 205, a device 210, and a device 215 are mounted on a first surface of the circuit board 200. The devices 220 and 225 are mounted on a second surface of the circuit board 200. In this embodiment, devices on opposite sides of the circuit board 200 are non-overlapping. That is, the attach regions on opposite sides of the circuit board 200 would not overlap if they were in the same plane. Thus, one edge of the attach region of the device 205 is adjacent to the attach region of the device 220 but on the opposite side of the circuit board 200. Notably, in some embodiments, portions of the packaging or of heat dissipation mechanisms for these devices may extend outwardly beyond the attach region and therefore may overlap even if the attach regions do not. Where larger packages and/or heat dissipation mechanisms are present, staggering devices on opposite sides of the circuit board may advantageously allow higher density component placement.

Staggering the devices in this manner also allows through-hole vias to be conveniently used. As is illustrated in FIG. 2a, each device may use through-hole vias to connect to signal traces in the circuit board 200 without conflicting with the vias of another device. The use of through-hole vias may be advantageous as less expensive circuit boards may be produced if simple through-hole via technology is used instead of complex partial vias, blind vias, and/or buried vias.

In cases where via density is a limiting factor in designing the circuit board, this staggering arrangement may help reduce stub lengths. The stub length is the distance from an internal connection point of a device, such as a bond pad of an integrated circuit, to the connection point to the bus on the circuit board. This stub may include various sections of package routing as well as routing in the circuit board before the final bus trace is reached. Lengthy stubs typically lead to poor signal quality in a multi-load, high frequency signaling environment.

In cases where via density is a limiting factor, the use of through-hole vias with stacked devices (i.e., devices directly above/below each other) may require enlarging the region of vias in the circuit board. For example, if the region of vias directly under each device is completely filled by through-hole vias required for pins on that device, mounting another device directly opposite the device would require an enlargement of the total via field area by the surface area of the added device. In other words, if the same component is mounted back-to-back with through-hole vias where vias from one device already populate the region to the maximum via density, the surface area required for the vias for both back-to-back devices would double. Due to this increase in surface area, on average, the stub length to reach a bus trace may be expected to increase by a factor of the square root of two. Therefore, avoiding such back-to-back placement by staggering devices may help to limit stub lengths.

Figure 2B:
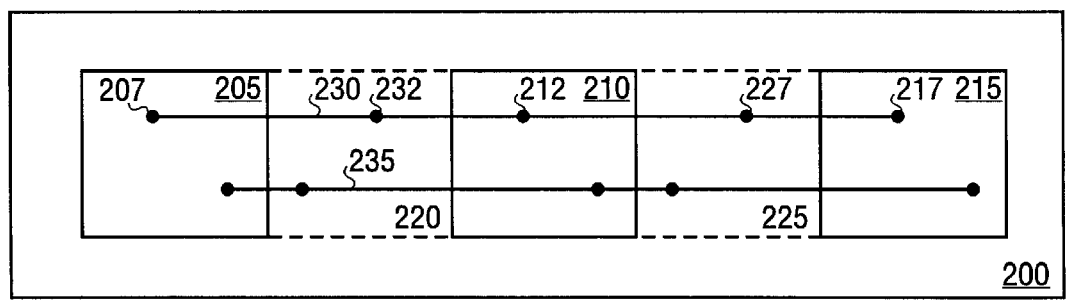

Additionally, the embodiment illustrated in FIGS. 2a and 2b may advantageously ensure that a minimum stub offset is maintained, meaning that there is at least a minimum distance between connection points to a trace on the bus. Maintaining a minimum stub offset is another technique which may help improve signal quality in a high-speed signaling environment. If stubs from multiple devices driving a signal line connect to the signal line at the same point or at small distances from one another (i.e., if they have little or no stub offset), more reflections are likely to be present when these devices drive the bus. In the prior art, efforts to increase device density often lead to a reduction in or elimination of the stub offset.

Figure 3:
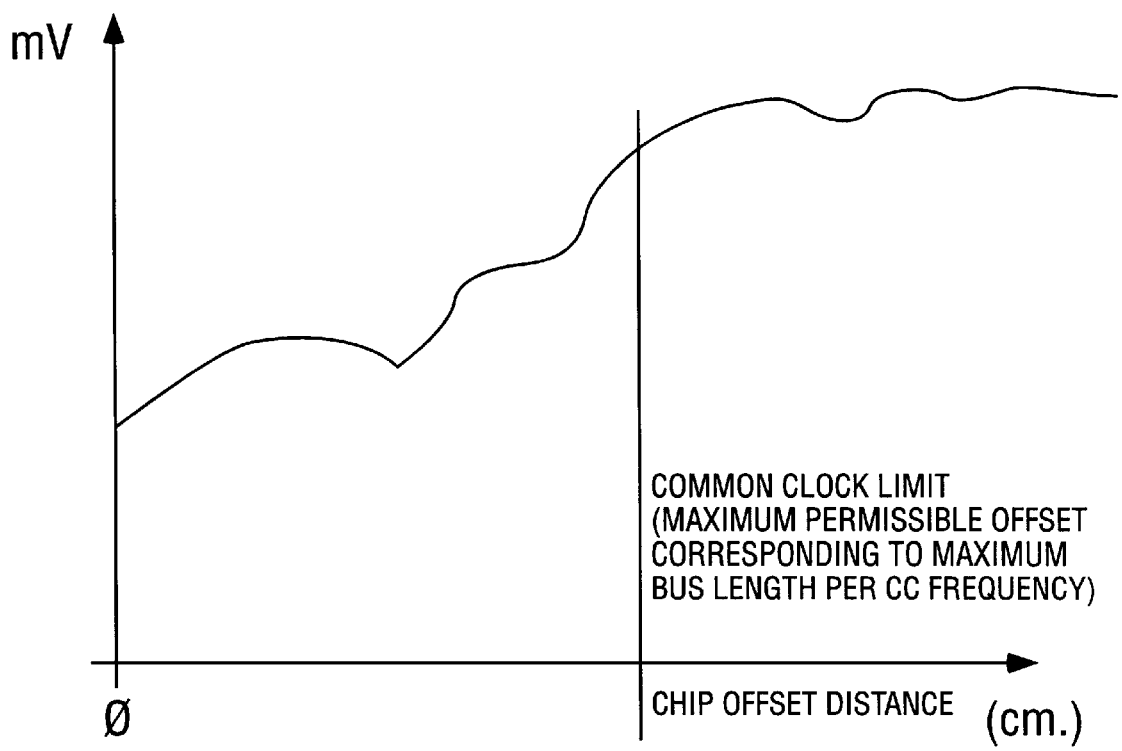
FIG. 3 illustrates a graph of the worst case available signal amplitude among all the receivers on a bus for one embodiment.

FIG. 3 illustrates, for one embodiment, the effect on signal quality of changing chip offset distances. Changing the chip offset generally results in altered stub offsets for each trace. FIG. 3 depicts the worst case available signal amplitude (e.g., in millivolts) among all the receivers on the relevant bus. Larger signal amplitudes at the receiver translate toi-better signal quality because noise at the receiver may be more easily rejected when a larger signal is present. Thus, generally, larger chip offsets translate to better signal quality in a high speed signaling environment.

Additionally, FIG. 3 indicates a common clock limit 310 for a system utilizing at least some common clock signals. A common clock system includes signals that are driven with reference to a common clock shared by multiple devices on the circuit board. The common clock limit reflects the notion that the flight time and hence the bus length is typically limited in a common clock system so that signals can propagate as needed within a predetermined number of periods (usually one) of the clock signal. Therefore, smaller chip offsets generally allow a higher common clock frequency.

In the exemplary graph of FIG. 3, the signal amplitude generally improves as chip offsets increase until a certain point is reached. In other embodiments, the behavior may differ, with the profile being largely determined by reflections in the system. To allow a high frequency common clock, a chip offset 320 may be selected which is less than the common clock limit 310 in some embodiments. In order to provide margin, the chip offset 320 may be chosen a bit less than the common clock limit distance.

In a particular system, a family of similar curves may be analyzed for the various signals routed on the circuit board. The graph in FIG. 3 reflects aggregate system information for many or all signal lines at each chip offset. That is, the worst case signal of a group of signals at a particular chip offset distance is reflected in the graph at each offset distance, thereby allowing analysis of signal groups. Alternatively, each stub offset could be individually analyzed. In either case, the minimum chip or stub offset distance may be adjusted as a function of the desired signal quality and a common clock signal frequency.

In the embodiment of FIGS. 2a the and 2b, pins 207, 232, 212, 227, and 217 are connected to a signal line 230 at connection points separated by a stub offset approximately equal to one-half of the width of each device. On the other hand, connections to the signal line 235 have a smaller minimum stub offset and a larger maximum stub offset, but since the smaller distance typically creates a noisier signal it is usually treated as the worst-case. By arranging signals that require higher signal quality or that operate at a higher frequency in regions of the devices that ensure greater stub offsets (e.g., toward the center of the device), a minimum stub offset may be ensured. Alternatively, sufficient minimum stub offsets may be maintained simply due to the staggered nature of the devices on the circuit board (without special pin arrangements).

The devices mounted on discussed circuit boards may be any of a variety of types of memory devices or processing devices that communicate via substantial interconnections (e.g., one or more buses). For example, processing devices include general purpose processors, special purpose processors, media processors, graphics processors, broadband processors, real-time video and/or audio processors, any combination thereof, as well as any other appropriate known or otherwise available processor may all work in close cooperation and may benefit from disclosed circuit board arrangements.

Figure 4A:
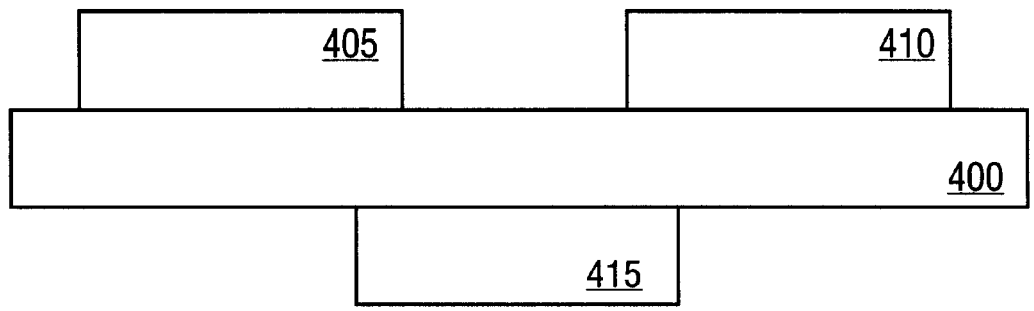
FIG. 4a illustrates one embodiment of a circuit board having predominantly non-overlapping devices mounted on opposite sides of the circuit board.

FIG. 4a illustrates a two sided circuit board 400 having devices mounted in a predominantly non-overlapping staggered manner. In particular, a device 405 and a device 410 are mounted on a first side of the circuit board 400. In this embodiment, these devices have attach regions of the same size as a device. In other embodiments, the attach region may be smaller than the device itself. A device 415 is mounted on a second side of the circuit board 400 with an attach region that overlaps both the attach region of device 405 and the attach region of the device 410.

Figure 4B:
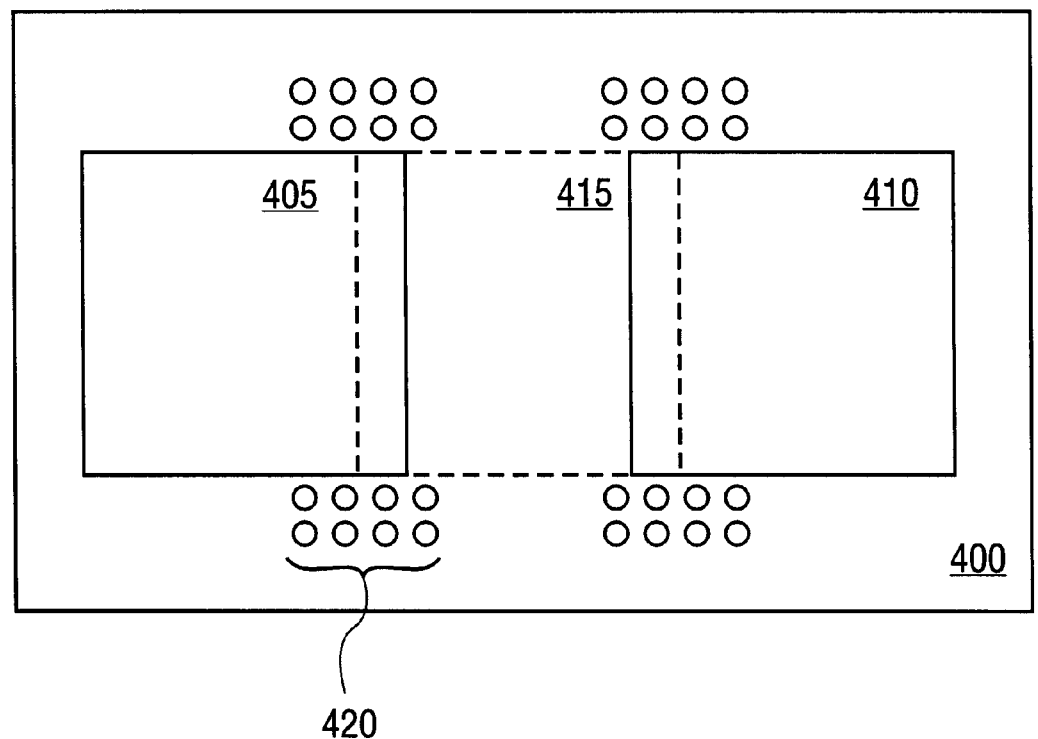

Due to this overlap, as can be seen in FIG. 4b, an expanded via region 420 is formed. This expanded via region results in an increase in some stub lengths, however, it also results in the devices being placed closer together. The devices being placed closer together may be advantageous in a system where some signals are common clock signals. In such cases, limiting the overall length of the bus may be important to allow the common clock to operate at a sufficiently high frequency. Having devices overlap, however, is not required to use techniques of the present invention.

Figure 5:
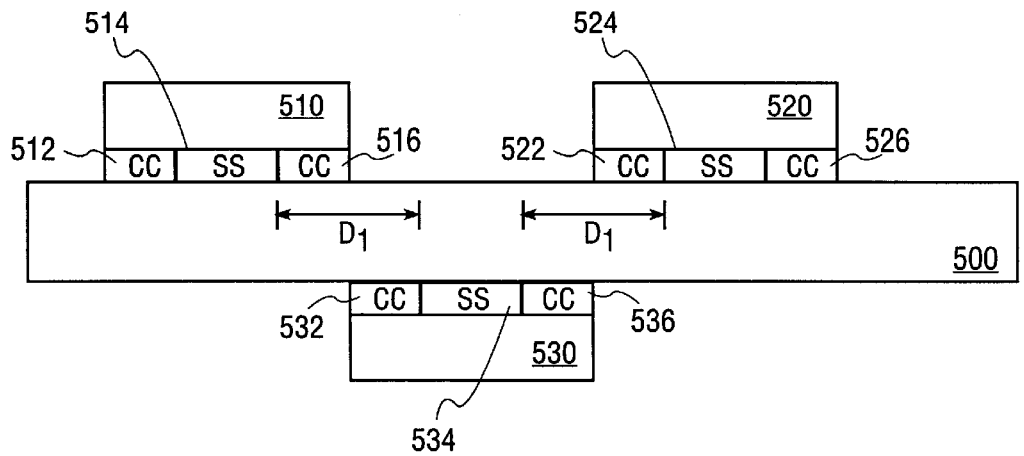
FIG. 5 illustrates one embodiment of a circuit board having attached devices with pins separated into regions by pin type.

FIG. 5 illustrates one embodiment of a circuit board 500 having attached devices with pins separated into regions by pin type. A device 510 and a device 520 are attached to a first surface of the circuit board 500. A device 530 is attached to a second surface of the circuit board 500. The device 510 includes a region 512 and a region 516 of a first type of pin node for a first type of signal. The device 510 also includes a region 514 with a second type of pin for a second type of signal.

Notably, the pins, despite being referred to as being of different types, may be physically identical; however, different types of signals may be routed through these pins. For example, the regions 512 and 516 may be regions for common clock (CC) signals, and the region 514 may be a region for source synchronous (SS) signals. Source synchronous signals are signals that are transmitted with an accompanying clock or strobe signal to capture the signal at a destination. As such, source synchronous signals may warrant special treatment because the waveform of the clock transmitted with the data signals may be important to ensure that proper data is captured. Additionally, source synchronous signal buses may transfer data on multiple clock edges and therefore may have a higher data transfer rate than other signals in the system. Alternatively, other types of signals may be grouped into different regions based on one set of signals having a higher desired signal quality. For example, signals expected to operate at a higher frequency or particularly sensitive signals, such as clocks or strobes, may be separated into a region exhibiting superior signal quality characteristic.

Similarly, the device 520 includes regions 522 and 526 having pins of the first type, as well as a region 524 having pins of the second type. The device 530 has regions 532 and 536 with pins of the first type and region 534 having pins of the second type. A minimum distance of D1 is maintained between the regions 514 and 534 as well as the regions 524 and 534. Since the regions themselves are separated by the distance D1, the minimum stub offset is also D1 for pins in the regions separated by the distance D1 in this embodiment.

Figure 6:
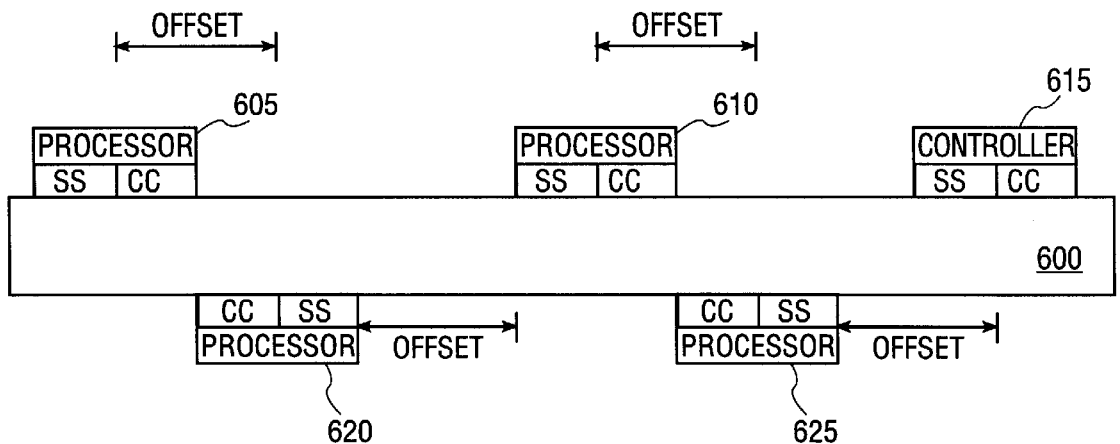
FIG. 6 illustrates another embodiment of a circuit board having attached devices with pins separated into regions by pin type.

FIG. 6 illustrates another embodiment having devices with pins separated into regions based on pin type. In this case, a circuit board 600 has a processor 605, a processor 610, and a controller 615 mounted on a first side of the circuit board. A processor 620 and a processor 625 are mounted on a second side of the circuit board. Each device includes pins separated into regions based on the signal type being transmitted. In the case of processors 605 and 620, the common clock signals of both processors separate the source synchronous signals. Therefore, the desired stub offset is achieved by the intervening region of non-source synchronous signals. In the case of the processor 620 and the processor 610, an additional offset is added because the source synchronous signal regions would otherwise be adjacent. Again, in the case of the processors 610 and 625, the common clock signal regions suffice to provide an offset between source synchronous signal regions.

Advantageously, each of the processors 605, 610, 620 and 625 have the same pin arrangement. Therefore, all processors may be identical parts. Since the controller 615 is a different part than the processors, its pin arrangement may be different then the processors. As illustrated, the controller 615 may have its common clock signals located between the source synchronous signals of the processor 625 and those of the controller such that the region of common clock signals on the controller helps minimize the chip offset needed between the controller 615 and the processor 625 to achieve desired stub offsets. In this particular example, the regions of source synchronous and common clock signals are reversed with respect to those of the processors.

Many other embodiments utilizing grouped pins by signal type are possible. For example, signals may be divided by different criteria than whether they are source synchronous or common clock signals. In some embodiments, such signal grouping may be employed on a single sided circuit board. In some embodiments, the attach regions may be completely non-overlapping or only predominantly non-overlapping as previously discussed. In some cases, there may be significant overlap of pins for which the signal quality is of less concern. Additionally, there may be no clear second group of signals, but rather only a first group for which a higher quality signal is desired and which is located on the device to provide some minimum stub offset chosen to achieve a particular signal quality.

Thus, a method and apparatus for interconnecting multiple devices on a circuit board is disclosed. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art upon studying this disclosure.

What is claimed is:

1. An apparatus comprising:
   a circuit board having a first surface, a second surface, and a plurality of signal traces comprising a bus; and
   a plurality of interconnected devices mounted on said first surface of said circuit board and said second surface of said circuit board and coupled to said bus, said plurality of devices having predominantly non-overlapping attach regions and having at least a minimum stub offset.

2. The apparatus of claim 1 wherein said plurality of devices comprises:
   a first device having a first attach region including a first plurality of pins electrically coupled to said plurality of signal traces, the first device being mounted on said first surface of said circuit board substantially parallel to said first surface of said circuit board; and
   a second device having a second attach region including a second plurality of pins electrically coupled to said plurality of signal traces, the second device being mounted on said second surface of said circuit board substantially parallel to said second surface of said circuit board.

3. The apparatus of claim 2 wherein said first attach region has a first attach region first edge and a first attach region second edge parallel to the first attach region first edge, and wherein the second attach region has a second attach region first edge and a second attach region second edge, and further wherein said first attach region first edge is approximately aligned with said second attach region first edge on the opposite side of the circuit board, and wherein said first attach region and said second attach region are non-overlapping.

4. The apparatus of claim 1 wherein a plurality of through-hole vias connect pins from each of said plurality of devices to said plurality of signal traces.

5. The apparatus of claim 1 wherein each of said plurality of devices has at least two different types of pins separated into different regions, and wherein said plurality of devices are mounted to ensure said minimum stub offset between corresponding connection points to said plurality of signal traces of one of said two different types of pins.

6. The apparatus of claim 2 wherein said first plurality of pins comprises a first plurality of a first type of pin and a first plurality of a second type of pin, and wherein said second plurality of pins comprises a second plurality of the first type of pin and a second plurality of the second type of pin, and further wherein said first plurality of the second type of pin and said second plurality of the second type of pin are separated by at least one of said first plurality of the first type of pin and the second plurality of the first type of pin.

7. The apparatus of claim 6 wherein the first plurality of the first type of pin and the second plurality of the first type of pin are adjacent in the plane of the circuit board but located on opposite sides of the circuit board.

8. The apparatus of claim 7 wherein said first type of pin is a common clock pin and wherein said second type of pin is a source synchronous pin.

9. The apparatus of claim 2 wherein said plurality of devices further comprises:
   a third device having a third attach region including a third plurality of pins electrically coupled to the plurality of signal traces, the third device being mounted on said first surface of said circuit board substantially parallel to said first surface of said circuit board, said third attach region being predominantly non-overlapping with respect to the second attach region; and
   a fourth device having a fourth attach region including a fourth plurality of pins electrically coupled to the plurality of signal traces, the fourth device being mounted on said second surface of said circuit board substantially parallel to said second surface of said circuit board, said fourth attach region being predominantly non-overlapping with respect to the third attach region; and
   a fifth device having a fifth plurality of pins electrically coupled to the plurality of signal traces, the fifth device being mounted on said first surface of said circuit board substantially parallel to said second surface of said circuit board and predominantly non-overlapping with respect to said fourth attach region.

10. The apparatus of claim 9 wherein said first, second, third, fourth and fifth devices include a first type of pin for a first signal type and a second type of pin for a second signal type, and wherein regions containing the second type of pin are separated by either regions of said first type of pin or by an offset between devices.

11. The apparatus of claim 2 wherein a plurality of through-hole vias are used to connect said first plurality of pins and said second plurality of pins to said plurality of signal traces, and wherein said first attach region partially overlaps said second attach region, and further wherein an expanded via region is formed at the overlap of the first attach region and the second attach region.

12. The circuit board of claim 1 wherein said minimum stub offset is chosen based on a desired signal quality and a common clock signal frequency.

13. A circuit board comprising:
a first attach region on a first surface of said circuit board, said first attach region for coupling a first plurality of pins from a first processing device to a plurality of signal lines;
a first plurality of through-hole vias to connect said first plurality of pins to said plurality of signal lines;
a second attach region on a second surface of said circuit board, said second attach region for coupling a second plurality of pins from a second processing device to said plurality of signal lines and being at least predominantly non-overlapping with respect to said first attach region;
a second plurality of through-hole vias to connect said second plurality of pins to said plurality of signal lines each of said plurality of signal lines being at least a minimum length and therefore providing a minimum stub offset that is greater than a minimum stub offset distance.

14. The circuit board of claim 13 wherein said minimum stub offset is chosen based on a desired signal quality and a common clock signal frequency.

15. The circuit board of claim 13 wherein said first plurality of pins includes a first plurality of a first type of pin and a first plurality of a second type of pin, and wherein said second plurality of pins includes a second plurality of said first type of pin and a second plurality of said second type of pin, and further wherein said first plurality of said second type of pin and said second plurality of said second type of pin are separated by at least some of either or both of said first plurality of said first type of pin and said second plurality of said first type of pin.

16. The circuit board of claim 15 wherein said first type of pin is a common clock signal pin and wherein said second type of pin is a source synchronous signal pin.

17. The circuit board of claim 15 wherein said first plurality of said first type of pin is adjacent to but on an opposite side of said circuit board with respect to said second plurality of said first type of pin, and further wherein said first plurality of said second type of pin and said second plurality of said second type of pin are located at remote ends of said first attach region and said second attach region, the remote ends at which the first and second plurality of said second type of pin are located being remote in that the remote ends are separated from each other in a plane of the circuit board by regions including the first and second plurality of the first type of signal pins, the circuit board further comprising:
a third attach region on said first surface of said circuit board, said third attach region including a third plurality of said first type of pin and a third plurality of said second type of pin, said third plurality of said first type of pin being located at a remote end of said third attach region with respect to said second attach region, said third plurality of said second type of pin being located adjacent to said second attach region.

18. The circuit board of claim 17 wherein said first attach region and said second attach region are approximately adjacent and wherein said second attach region and said third attach region are offset by a first distance.

19. A method comprising:
mounting a first processor on a first side of a circuit board, said first processor having a first plurality of a first type of signals; and
mounting a second processor on a second side of said circuit board, said second processor having a second plurality of said first type of signals, said second processor being mounted so that a plurality of a second type of signals on at least one of said first processor and said second processor separate said first plurality of said first type of signals and said second plurality of said first type of signals.

20. The method of claim 19 further comprising:
mounting a third processor on said first side of said circuit board so that an offset separates signals of said first type of said second processor and said third processor.

21. The method of claim 19 wherein said first type of signals are source synchronous signals and said second type of signals are non-source synchronous signals, the method further comprising:
mounting a plurality of additional processors so that source synchronous signals of each processor are separated by either a plurality of non-source synchronous signals or an offset.

22. An apparatus comprising:
a circuit board having a first plurality of signal lines and a second plurality of signal lines;
a first device having a first device first edge and a first plurality of a first type of interconnect node for a first signal type and a first plurality of a second type of interconnect node for a second signal type, the first plurality of the first type of interconnect node being located in a first region; and
a second device having a second plurality of said first type of interconnect node and a second plurality of said second type of interconnect node, said second device having a second device first edge mounted parallel to said first device first edge and a second device second edge opposite said second device first edge and further distant from said first device than said second device first edge, said second plurality of said first type of interconnect node being located in a second region, said first region and said second region being separated by an intermediate region including at least some of either or both of said first plurality of said second type of interconnect node and said second plurality of said second type of interconnect node.

23. The apparatus of claim 22 wherein said first plurality of said first type of interconnect node is adjacent to said first device first edge, the first plurality of the second type of interconnect node being located in a second region further from said first device first edge than said first region, and wherein said second plurality of said first type of interconnect signal is adjacent to said second device first edge.

24. The apparatus of claim 22 further comprising:
a third device having a third plurality of said first type of interconnect node and a third plurality of said second type of interconnect node, said third device having a third device first edge mounted parallel to said second device second edge and closer to said second device second edge than a third device second edge that is opposite said third device first edge, said third plurality of said second type of interconnect node being located adjacent to said third device first edge, said third plurality of said first type of interconnect node being located in a third region further from said third device first edge said third plurality of said second type of interconnect node.

25. The apparatus of claim 24 wherein said first device and said third device are on a first side of said circuit board, and wherein said third device is offset from said second device which is on a second side of the circuit board to maintain a minimum stub offset.

26. The apparatus of claim 25 further comprising:

a fourth device having a fourth plurality of said first type of interconnect node and a fourth plurality of said second type of interconnect node, said fourth device having a fourth device first edge mounted parallel to said third device second edge and closer to said third device second edge than a fourth device second edge that is opposite said fourth device first edge, said fourth plurality of said first type of interconnect node being located adjacent to said fourth device first edge, said fourth plurality of said second type of interconnect node being located further from said fourth device first edge than said fourth plurality of said first type of interconnect node; and a fifth device having a fifth plurality of said first type of interconnect node and a fifth plurality of said second type of interconnect node, said fifth device having said fifth device first edge mounted parallel to said fourth device second edge and closer to send fourth device second edge than a fifth device second edge that is opposite said fifth device first edge, said fifth plurality of said first type of interconnect node being located to said fifth device first edge, said fifth plurality of said second type of interconnect node being located further from said fifth device first edge than said fifth plurality of said first type of interconnect node, said fifth device being offset from said fourth device to maintain a minimum distance between connections to interconnect nodes of said second type.

\* \* \* \* \*